United States Patent
Graf et al.

(10) Patent No.: US 12,206,361 B2
(45) Date of Patent: Jan. 21, 2025

(54) OSCILLATOR FREQUENCY ACCURACY AND AMPLITUDE CONTROL

(71) Applicant: TEXAS INSTRUMENTS INCORPORATED, Dallas, TX (US)

(72) Inventors: Hagen Graf, Oslo (NO); Danielle Griffith, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 140 days.

(21) Appl. No.: 18/078,723

(22) Filed: Dec. 9, 2022

(65) Prior Publication Data

US 2023/0188093 A1  Jun. 15, 2023

Related U.S. Application Data

(60) Provisional application No. 63/289,677, filed on Dec. 15, 2021.

(51) Int. Cl.
*H03B 5/36* (2006.01)
*H03B 5/04* (2006.01)

(52) U.S. Cl.
CPC ............ *H03B 5/364* (2013.01); *H03B 5/04* (2013.01); *H03B 2200/0012* (2013.01); *H03B 2200/0038* (2013.01)

(58) Field of Classification Search
CPC .......... H03B 5/364; H03B 5/04; H03B 5/362; H03B 5/366; H03B 2200/0012; H03B 2200/0038; H03B 2201/031
See application file for complete search history.

(56) References Cited

U.S. PATENT DOCUMENTS

| | | |
|---|---|---|
| 8,049,569 B1 | 11/2011 | Wright |
| 2007/0176697 A1 | 8/2007 | May |
| 2007/0298729 A1 | 12/2007 | Kappes |
| 2012/0092080 A1 | 4/2012 | Nemoto |
| 2017/0004852 A1 | 1/2017 | Cao |
| 2019/0007005 A1* | 1/2019 | Marques ............ H01L 27/0727 |
| 2020/0244223 A1* | 7/2020 | Yamamoto ............ H03B 5/368 |

FOREIGN PATENT DOCUMENTS

KR    20170004852 A    1/2017

* cited by examiner

*Primary Examiner* — Jeffrey M Shin
(74) *Attorney, Agent, or Firm* — Mandy Barsilai Fernandez; Frank D. Cimino (57) ABSTRACT

In examples, an electronic device comprises an oscillator circuit configured to provide an output signal and a controller coupled to the oscillator circuit. The controller is configured to receive first and second target rates; dynamically adjust a frequency accuracy of the output signal based on the first target rate; and dynamically adjust an amplitude of the output signal based on the second target rate.

21 Claims, 8 Drawing Sheets

| TARGET CAPACITANCE VALUE | DIGITAL CONTROL OUTPUT |
|---|---|
| 00000 | 10100 |
| 00001 | 10001 |
| 00010 | 01111 |
| 00011 | 00000 |
| 00100 | 01110 |
| 00101 | 11000 |
| 00110 | 11010 |
| 00111 | 11111 |

802 — RECEIVING A FIRST TARGET VALUE AND A FIRST THRESHOLD RATE FOR A FREQUENCY ACCURACY OF AN OSCILLATOR OUTPUT SIGNAL

804 — RECEIVING A SECOND TARGET VALUE AND A SECOND THRESHOLD RATE FOR AN AMPLITUDE OF THE OSCILLATOR OUTPUT SIGNAL

806 — ADJUSTING A FIRST CURRENT VALUE OF THE FREQUENCY ACCURACY OF THE OSCILLATOR OUTPUT SIGNAL TOWARD THE FIRST TARGET VALUE AT A RATE LESS THAN OR EQUAL TO THE FIRST THRESHOLD RATE

808 — ADJUSTING A SECOND CURRENT VALUE OF THE AMPLITUDE OF THE OSCILLATOR OUTPUT SIGNAL TOWARD THE SECOND TARGET VALUE AT A RATE LESS THAN OR EQUAL TO THE SECOND THRESHOLD RATE

OSCILLATOR FREQUENCY ACCURACY AND AMPLITUDE CONTROL

CROSS-REFERENCE TO RELATED APPLICATIONS

The present application claims priority to U.S. Provisional Patent Application No. 63/289,677, which was filed Dec. 15, 2021, is titled "Digital Amplitude Control Loop For A Crystal Oscillator With The Ability To Dynamically Trade Off Power Versus Performance Using Smooth Transitions," and is hereby incorporated herein by reference in its entirety.

BACKGROUND

Circuits perform various operations. Some circuit operations may benefit from a clock signal. Oscillators can provide such clock signals to circuits. Oscillators can provide clock signals having different frequencies, and an oscillator can provide a clock signal at a particular frequency with varying accuracy levels. For example, in applications (e.g., radio frequency communications) calling for a high clock signal frequency accuracy level, an oscillator may operate in a high power mode, providing a clock signal that varies only slightly from a target frequency. Conversely, in applications (e.g., idle timekeeping) calling for a low clock signal frequency accuracy level, an oscillator may operate in a low power mode, providing a clock signal that can vary more significantly from the target frequency.

SUMMARY

In examples, an electronic device comprises an oscillator circuit configured to provide an output signal and a controller coupled to the oscillator circuit. The controller is configured to receive first and second target rates; dynamically adjust a frequency accuracy of the output signal based on the first target rate; and dynamically adjust an amplitude of the output signal based on the second target rate.

In examples, a method comprises receiving a first target value and a first threshold rate for a frequency accuracy of an oscillator output signal; receiving a second target value and a second threshold rate for an amplitude of the oscillator output signal; adjusting a first value of the frequency accuracy of the oscillator output signal toward the first target value at a rate less than or equal to the first threshold rate; and adjusting a second value of the amplitude of the oscillator output signal toward the second target value at a rate less than or equal to the second threshold rate.

DETAILED DESCRIPTION

As described above, an oscillator may have different operation modes that exploit the tradeoff between power consumption and clock signal frequency accuracy. For example, an oscillator may have a first power mode in which the oscillator consumes large amounts of power but provides a highly accurate clock signal frequency, and a second power mode in which the oscillator consumes small amounts of power but provides a less accurate clock signal frequency.

In many applications, however, two oscillator power modes do not provide adequate granularity. Some applications may call for additional power modes between the first and second power modes. For instance, rather than high power consumption with high frequency accuracy or low power consumption with low frequency accuracy, an application may call for a mid-level power consumption with a mid-level frequency accuracy. Other applications may call for even finer granularity.

Further, large gradients between power modes can destabilize oscillator circuits. For example, when switching from a high power, high frequency accuracy mode to a low power, low frequency accuracy mode, the amount of energy in the oscillator circuit crystal may vary significantly. This energy gradient applied to the crystal can destabilize the oscillator circuit, resulting in malformed clock pulses, lost clock pulses, or stopped oscillation.

This description provides various examples of an electronic device that mitigates the challenges described above. Specifically, the electronic device includes a crystal oscillator circuit and digital controllers coupled to the oscillator circuit. The digital controllers receive inputs (e.g., from a processor in the electronic device) specifying target amplitude and frequency accuracy levels for the oscillator circuit clock signal. The inputs also specify the rate at which the oscillator should transition from current amplitude and frequency accuracy levels to the target amplitude and frequency accuracy levels. The digital controllers control components in the oscillator circuit, such as variable capacitors, variable resistors, and current mirrors, to achieve the target amplitude and frequency accuracy levels specified by the inputs to the digital controllers. Further, the digital controllers control the oscillator circuit to achieve the target amplitude and frequency accuracy levels at the target rates specified by the inputs to the digital controllers. In this way, the oscillator circuit can be controlled to provide specific clock signal amplitudes and frequency accuracy levels with a high granularity level. Further, the oscillator circuit can be controlled to smoothly and gradually transition to the target clock signal amplitudes and frequency accuracy levels, thus avoiding oscillator circuit destabilization secondary to large energy gradients at the oscillator circuit crystal.

Figure 1:
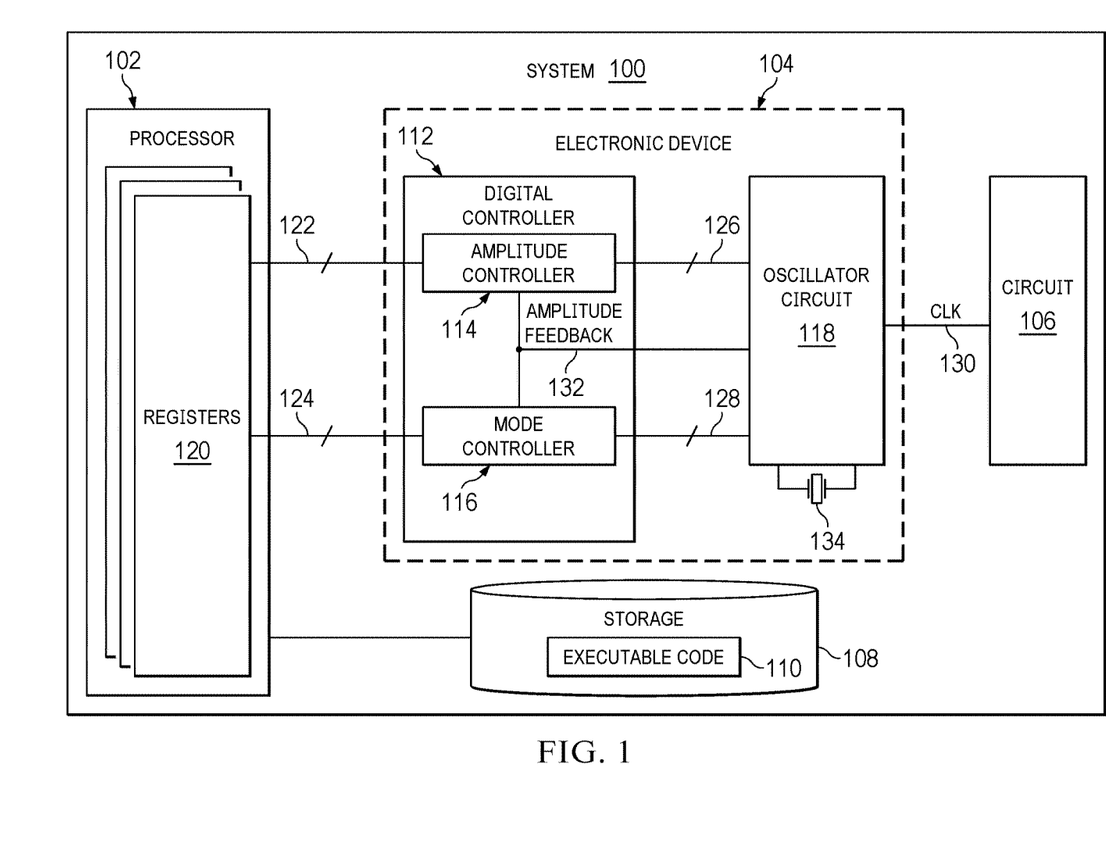
FIG. 1 is a block diagram of a system configured to control oscillator frequency accuracy and amplitude, in accordance with various examples.

FIG. 1 is a block diagram of a system 100 configured to control oscillator frequency accuracy and power (e.g., amplitude), in accordance with various examples. The example system 100 may be, include, or be a part of a personal computer, a server, an appliance, a networking apparatus, an automobile, an aircraft, a spacecraft, or any other suitable technology that may include an oscillator. The system 100 includes a processor 102, an electronic device 104, a circuit 106, and storage 108. In examples, the components of the electronic device 104 are included in a single semiconductor package. In examples, the components of the electronic device 104 are distributed among two or more semiconductor packages. The circuit 106 is any type of circuit that uses a clock signal generated by an oscillator. The circuit 106 may utilize the clock signal to perform radio frequency, computing, and/or timekeeping applications, for example. The storage 108 is any suitable type of storage, such as random access memory (RAM) or read-only memory (ROM). In examples, the processor 102, the electronic device 104, the circuit 106, and/or the storage 108 are co-mounted on a common printed circuit board (not expressly shown). In other examples, the processor 102, the electronic device 104, the circuit 106, and/or the storage 108 are mounted on two or more printed circuit boards.

The storage 108 includes executable code 110, which, when executed by the processor 102, causes the processor 102 to perform some or all of the actions attributed herein to the processor 102. The electronic device 104 includes a digital controller 112, which, in turn, includes an amplitude controller 114 and a mode controller 116. Example structures and operations of the amplitude controller 114 and the mode controller 116 are described below. The electronic device 104 also includes an oscillator circuit 118, example structures and operations of which are also described below. The processor 102 includes one or more registers 120, example operations of which are described below.

Connection 122 couples the processor 102 and the amplitude controller 114. Connection 124 couples the processor 102 and the mode controller 116. Connection 126 couples the amplitude controller 114 and the oscillator circuit 118. Connection 128 couples the mode controller 116 and the oscillator circuit 118. Connection 130 couples the oscillator circuit 118 to the circuit 106. Amplitude feedback connection 132 couples the oscillator circuit 118 to the amplitude controller 114 and the mode controller 116. The oscillator circuit 118 couples to a crystal 134. In examples, the crystal 134 is part of the electronic device 104, and in other examples, the crystal 134 is external to the electronic device 104. Similarly, the various components shown in FIG. 1 as being within the electronic device 104 may, in examples, be external to the electronic device 104. The various connections described herein are examples and do not limit the scope of this disclosure. In the drawings, a slash extending through a connection denotes that the connection may include multiple connections but is represented and referred to herein as a single connection to preserve clarity and simplicity. It is also within the scope of this disclosure for a connection not having a slash therethrough to include one or more connections. Similarly, the scope of this disclosure is not limited to the precise configuration of components shown in the drawings.

In operation, the oscillator circuit 118 provides a clock signal CLK to the circuit 106. The circuit 106 uses CLK in any suitable way. The digital controller 112 controls the oscillator circuit 118 based on inputs received from the registers 120. For example, the digital controller 112 dynamically adjusts components within the oscillator circuit 118 to dynamically control the amplitude and the frequency accuracy of CLK. For instance, the digital controller 112 may adjust variable capacitors within the oscillator circuit 118 to cause the frequency of CLK to more accurately match a target frequency. Similarly, the digital controller 112 may adjust the variable capacitors within the oscillator circuit 118 to allow the frequency of CLK to vary to a greater degree relative to the target frequency (e.g., the digital controller 112 may permit the CLK frequency accuracy to decrease). For instance, the digital controller 112 may adjust a variable resistor in the oscillator circuit 118, a current mirror in the oscillator circuit 118, or a combination thereof to increase or decrease the amplitude of CLK. As described below, in examples, the amplitude controller 114 is configured to control the amplitude of CLK by adjusting a current mirror of the oscillator circuit 118 via the connection 126. Similarly, as described below, in examples, the mode controller 116 is configured to control the amplitude of CLK and the frequency accuracy of CLK by adjusting a variable resistor and variable capacitors, respectively, of the oscillator circuit 118 via connection 128. The amplitude feedback connection 132 provides amplitude feedback from the oscillator circuit 118 to the amplitude controller 114 and the mode controller 116 to enable the amplitude controller 114 and mode controller 116 to maintain a target amplitude of CLK.

The amplitude controller 114 and the mode controller 116 control CLK by manipulating the oscillator circuit 118, as described above and as described in greater detail below. In some examples, the behaviors of the amplitude controller 114 and the mode controller 116 are determined by the contents of registers 120. Stated another way, a user, such as an engineer, designer, computer scientist, or software developer, may instruct the processor 102 (e.g., using inputs devices such as a keyboard, mouse, microphone, etc.) about a target amplitude and target frequency accuracy of CLK. The user may also instruct the processor 102 about a target rate at which the amplitude and frequency accuracy of CLK should be changed to the target amplitude and target frequency accuracy. As described above, an abrupt change in amplitude and/or frequency accuracy can destabilize the oscillator circuit 118. Thus, in examples, the target rate facilitates a smooth and gradual change in amplitude and frequency accuracy of CLK. The processor 102 receives such inputs and stores them to the registers 120 in any suitable data format, such as a data format that is comprehensible to the amplitude controller 114 and the mode controller 116. The amplitude controller 114 reads contents of the registers 120 via the connection 122 and the mode controller 116 reads contents of the registers 120 via the connection 124. The amplitude controller 114 and the mode controller 116 then operate to control the oscillator circuit 118 based on the fetched register contents. The remainder of this disclosure describes the various components of FIG. 1 in greater detail with reference to FIGS. 2-9.

Figure 2:
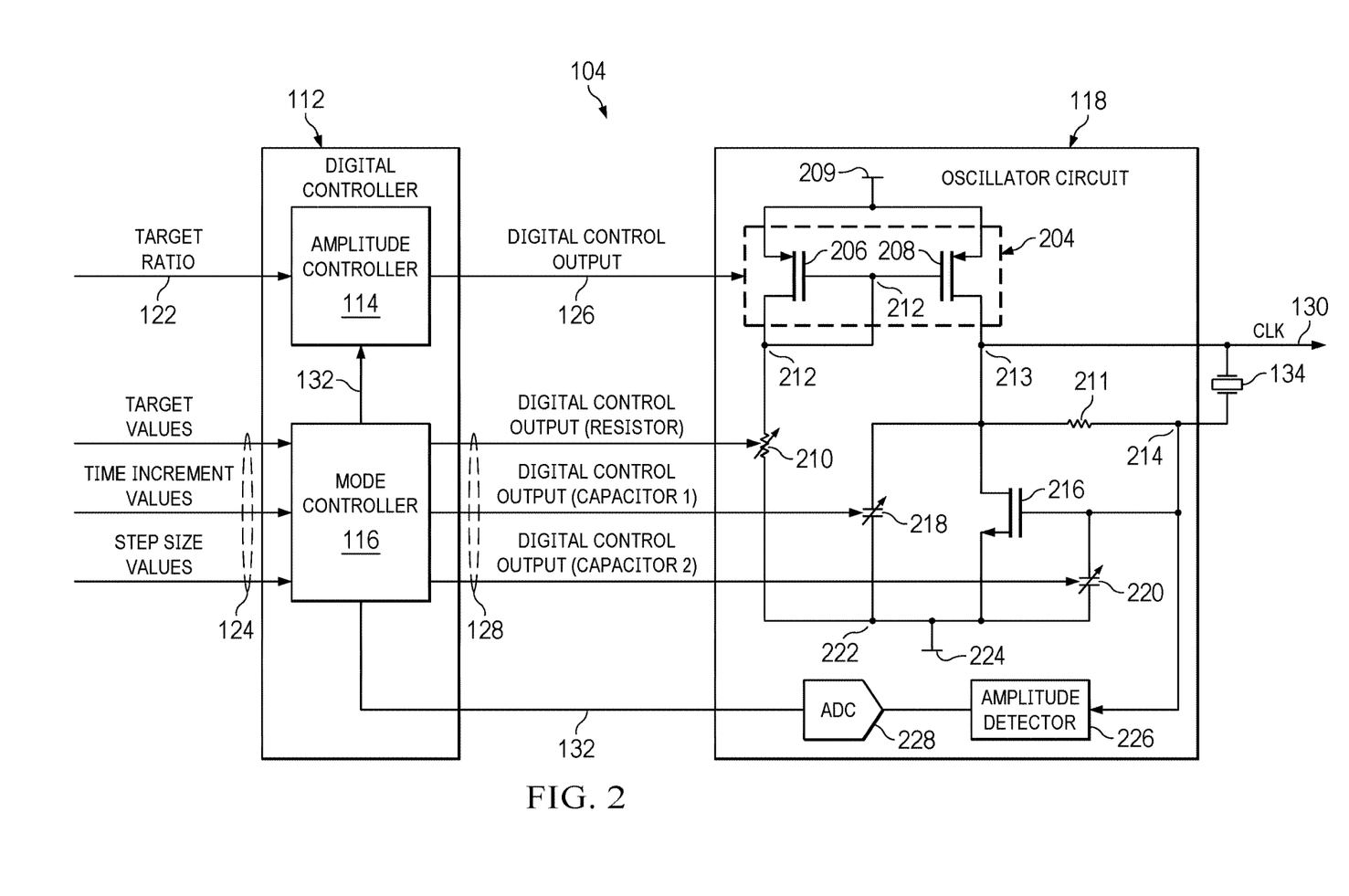
FIG. 2 is a circuit schematic diagram of an electronic device configured to control oscillator frequency accuracy and amplitude, in accordance with various examples.

FIG. 2 is a circuit schematic diagram of the electronic device 104, in accordance with various examples. As described, the electronic device 104 includes the digital controller 112 coupled to the oscillator circuit 118. In examples, the oscillator circuit 118 is a Pierce oscillator circuit. The scope of this disclosure includes other oscillator circuits, such as the Colpitts and Clapp oscillator circuits.

Although FIG. 2 shows the oscillator circuit 118 as a crystal oscillator circuit, non-crystal oscillator circuits may be useful. An example oscillator circuit 118 includes a current mirror 204 including a transistor 206 (e.g., a field effect transistor (FET), such as a metal oxide semiconductor FET (MOSFET)) and a transistor 208 (e.g., FET). In examples, the transistors 206 and 208 are p-type FETs. The sources of the transistors 206 and 208 are coupled to each other and to a voltage source 209. The gates of the transistors 206 and 208 are coupled to each other at a node 212. The drain of the transistor 206 is coupled to the node 212. The drain of the transistor 208 is coupled to a node 213.

The node 212 is coupled to a first end of a variable resistor 210 (e.g., a digital potentiometer). A second end of the variable resistor 210 is coupled to a node 222.

The node 213 is coupled to a first end of a resistor 211. A second end of the resistor 211 is coupled to a node 214. The crystal 134 (e.g., piezoelectric crystal) is coupled across the nodes 213 and 214. A transistor 216 (e.g., n-type FET) is coupled between the nodes 213 and 222. For example, a drain of the transistor 216 is coupled to node 213 and a source of the transistor 216 is coupled to node 222. A gate of the transistor 216 is coupled to node 214.

A variable capacitor 218 (e.g., digital tunable capacitor, digitally programmable variable capacitor) is coupled between nodes 213 and 222. A variable capacitor 220 is coupled between nodes 214 and 222. The variable capacitors 218 and 220 may be referred to as load capacitors. The node 222 couples to another voltage source 224. In some examples, the voltage source 224 is ground.

An amplitude detector 226 has an input coupled to node 214. In examples, the amplitude detector 226 may be coupled to nodes 213 and 214, in parallel with the crystal 134. The amplitude detector 226 has an output coupled to an input of an analog-to-digital converter (ADC) 228. An output of the ADC 228 is coupled to the amplitude feedback connection 132. The output of the oscillator circuit 118 is marked as connection 130 at node 213 and provides the clock signal CLK.

The digital controller 112 includes the amplitude controller 114 and the mode controller 116. The amplitude feedback connection 132 to the amplitude controller 114 and the mode controller 116 provides amplitude feedback from the oscillator circuit 118. In some examples, the amplitude feedback connection 132 couples directly to the mode controller 116 and directly to the amplitude controller 114, as FIG. 1 shows. In other examples, the amplitude feedback connection 132 couples directly to the mode controller 116, which, in turn, provides the amplitude feedback signal on amplitude feedback connection 132 (which shares numeral 132 with the connection 132 provided to mode controller 116 for consistency) to the amplitude controller 114, as FIG. 2 shows. Other configurations are also contemplated.

The amplitude controller 114 receives a target ratio input via connection 122. The target ratio indicates to the amplitude controller 114 the manner in which the amplitude controller 114 is to control the current mirror 204 in the oscillator circuit 118 to achieve a target amplitude of CLK. In examples, the amplitude controller 114 receives the target ratio from the registers 120 (FIG. 1).

The mode controller 116 receives inputs from the registers 120 (FIG. 1) via the connection 124. As described above, one or more of the connections depicted in the drawings may include multiple physical connections, even if depicted as being a single connection. For example, the connection 124 may include nine physical connections: three target input connections, three time increment input connections, and three step size input connections. The three target input connections indicate the target values for the variable resistor 210, the variable capacitor 218, and the variable capacitor 220. The three time increment input connections indicate how long the mode controller 116 should wait between receiving the target values for the variable resistor 210, variable capacitor 218, and variable capacitor 220 and effectuating these target values in the oscillator circuit 118. The three step size input connections indicate the largest steps the mode controller 116 may take when adjusting the variable resistor 210, the variable capacitor 218, and the variable capacitor 220. For example, the step size inputs may indicate that the mode controller 116 is to take the most granular steps possible when adjusting the variable resistor 210. Thus, instead of changing the digital control output to the variable resistor 210 from 0000 to 0100, the mode controller 116 may change the digital control output to the variable resistor 210 from 0000 to 0001, then 0010, then 0011, and then 0100. In this way, the mode controller 116 effectuates smooth, gradual changes between resistance and capacitance values in the oscillator circuit 118. FIG. 2 also shows connection 128, which may include three separate connections: a first output connection from the mode controller 116 to the variable resistor 210 by which the variable resistor 210 is controlled, a second output connection from the mode controller 116 to the variable capacitor 218 by which the variable capacitor 218 is controlled, and a third output connection from the mode controller 116 to the variable capacitor 220 by which the variable capacitor 220 is controlled.

The operation of the electronic device 104 is now described. First, the operation of the oscillator circuit 118 is described, followed by a description of the operation of the digital controller 112. The crystal 134 is a piezoelectric crystal. Accordingly, as a voltage is applied across the crystal 134, the crystal 134 undergoes a physical deformation. When the voltage is no longer applied across the crystal 134, the crystal 134 reverses its physical deformation and provides a voltage across its terminals (e.g., at nodes 213 and 214). The transistor 216 operates as an amplifier, with small voltage changes at the gate of transistor 216 producing significant changes in drain current. The crystal 134 and the transistor 216 are coupled together in a loop. The loop includes the transistor 216, node 213, crystal 134, and node 214. Because the variable capacitors 218, 220 (which may be referred to as load capacitors) are coupled to the nodes 213 and 214, respectively, the variable capacitors 218, 220 also are part of the loop. The voltage through this loop begins to oscillate and continues to oscillate as long as certain criteria for oscillation, known as the Barkhausen criteria, are satisfied. The Barkhausen criteria for oscillation include: i) the product of the gains around the loop must be at least unity at the desired frequency of oscillation; and ii) the total phase shift around the loop must be zero or any integer multiple of a (360 degrees). When the Barkhausen criteria are satisfied, the loop begins a startup phase of oscillation. Specifically, the transistor 216 amplifies noise in the loop (which may be any noise from any source in the circuit) and provides the amplified signal to the crystal 134. The crystal 134 has an inherent resonant frequency and operates as a filter by responding only to those signals having the resonant frequency. The crystal 134 does not respond to signals at other frequencies. The crystal 134 provides the signal at the resonant frequency back to the transistor 216, which amplifies the signal received from the crystal 134 and provides the amplified signal to the crystal 134. This oscillatory process of amplification and frequency filtering continues between the transistor 216 and crystal 134. The oscillation continues so long as the loop satisfies the Barkhausen criteria.

The loop in FIG. 2 satisfies the Barkhausen criteria because i) the transistor 216 is selected to provide a gain of at least unity; and ii) the total phase shift around the loop, including the transistor 216, the crystal 134, and the variable capacitors 218 and 220, is designed to be 0 or an integer multiple of $2\pi$. For example, the crystal 134 in combination with the variable capacitors 218 and 220 forms a pi network bandpass filter, which provides a 180° phase shift and a voltage gain from the output to input at approximately the resonant frequency of the crystal 134. At the frequency of oscillation, the crystal 134 appears inductive. The combination of the 180° phase shift (e.g., inverting gain) from the pi network and the negative gain from the transistor 216 results in a positive loop gain, making the bias point set by resistor 211 unstable and leading to oscillation.

The variable capacitors 218, 220 significantly control the frequency accuracy of the signal oscillating in the loop, and, thus, the clock signal CLK. More specifically, the crystal 134 is fabricated such that the resonance frequency is at a target value when the load capacitance provided by variable capacitors 218, 220 (e.g., the load capacitors) is at a specified value. If the load capacitance is lower, the resonance frequency of the crystal 134 is higher than the specified value (e.g., greater frequency error), but the power needed to sustain oscillation is relatively less. Because variable capacitors 218, 220 are coupled to ground, they appear in series across the crystal 134. Thus, for example, if the variable capacitors 218, 220 are both set at 16 pico Farads, the crystal 134 has a load capacitance of 8 pico Farads (equivalent to two 16 pico Farads capacitors in series). If the crystal 134 were specified to have an 8 pico Farad load capacitance, then setting the variable capacitors 218, 220 to 16 pico Farads each would produce the target resonance frequency. If, instead, the variable capacitors 218, 220 were set to 10 pico Farads each, the combined load capacitance would be 5 pico Farads, and the resonance frequency would be higher than the target value. Thus, adjusting the capacitances of the variable capacitors 218, 220 affects the frequency accuracy of the oscillating signal (and, thus, of CLK).

The current provided through the transistor 216 via node 213 significantly controls the amplitude of the oscillation signal in the loop, and, thus, the amplitude of CLK. The current mirror 204 and the variable resistor 210 control the amplitude of the current flowing through the transistor 216 via node 213. Within the current mirror 204, the transistor 206 (e.g., a p-type FET) and the transistor 208 (e.g., a p-type FET) are coupled to each other and to the voltage source 209 such that the transistors 206, 208 are on as long as the voltage source 209 provides power. For example, because the sources of the transistors 206 and 208 are coupled to voltage source 209, and because the gates of the transistors 206 and 208 are not coupled to a voltage source and instead are coupled to node 212, the gate-to-source voltage of each of the transistors 206 and 208 will be adequately low such that the transistors 206 and 208 are on as long as the voltage source 209 provides power. Further, because the gates of the transistors 206 and 208 are coupled together, and because the sources of the transistors 206 and 208 are coupled together, the transistors 206 and 208 behave virtually identically. The transistor 208 may have a larger size (e.g., larger dimensions facilitating a larger drain-to-source channel) than the transistor 206, and so the transistor 208 may provide a larger current than the transistor 206 for the same gate-to-source voltage. The current (or size) ratio of transistor 206 to transistor 208 may be expressed as 1:M, where transistor 208 is M times larger than transistor 206 in size, or where transistor 208 provides M times more current than transistor 206. In some examples, the transistor 208 represents multiple transistors that are coupled to each other in parallel, and the total current that these multiple transistors can provide is M times larger than the current that transistor 206 can provide. In such examples, individual bits of a digital code (e.g., the digital control output on connection 126) can be applied to the individual gates of the multiple transistors represented by transistor 208, thus controlling each of the multiple transistors to turn on or off on an individual basis. The drains of the multiple transistors can be coupled together and the sources of the multiple transistors can be coupled together to provide a single current to the node 213. In some such examples, the gates of the multiple transistors may not be coupled to the gate of the transistor 206.

In operation, the value of M in the ratio 1:M described above may be adjusted, such as by turning on and/or off one or more transistors represented by the transistor 208. As the value of M is adjusted, the current flowing through the transistor 208 (e.g., a set of transistors coupled in parallel) and node 213 will vary for a given current flowing through transistor 206. Accordingly, the amplitude of oscillation signal in the loop and of CLK may be increased or decreased. Increasing the current output of the transistor 208 (or a set of transistors represented by transistor 208) may increase the amplitude of CLK, and decreasing the current output of the transistor 208 (or a set of transistors represented by transistor 208) may decrease the amplitude of CLK. The current flowing through transistor 206 may be varied by adjusting the resistance of the variable resistor 210. Increasing the resistance may decrease the current flowing through the variable resistor 210 and the transistor 206, and decreasing the resistance may increase the current flowing through the variable resistor 210 and the transistor 206. Modulating the current flowing through the transistor 206 by adjusting the variable resistor 210 will also change the current flowing through node 213, thus affecting the amplitude of CLK and of the signal oscillating in the loop. Thus, the amplitude of CLK and of the signal oscillating in the loop may vary depending on how the current mirror 204, the variable resistor 210, or a combination thereof are controlled.

As described above, in the oscillator circuit 118, the capacitances of the variable capacitors 218, 220 may be dynamically adjusted to control the frequency accuracy of CLK. Further, as described above, in the oscillator circuit 118, the resistance of the variable resistor 210 and the ratio 1:M of the current mirror 204 may be dynamically adjusted to control the amplitude of CLK. These four components— the variable capacitor 218, the variable capacitor 220, the variable resistor 210, and the current mirror 204—may be controlled by the digital controller 112. Accordingly, the operation of the digital controller 112 is now described.

The amplitude controller 114 is configured to control the current mirror 204. The amplitude controller 114 receives a target ratio as an input. The target ratio specifies a target 1:M ratio for the current mirror 204. In examples, the target ratio is in a digital format that the amplitude controller 114 is configured to interpret. Responsive to receipt of the target ratio, the amplitude controller 114 provides a control signal on connection 126 to the current mirror 204. For example, the amplitude controller 114 provides a digital control signal on connection 126 that turns individual transistors represented by transistor 208 on and/or off, as described above. In examples, the amplitude controller 114 receives amplitude feedback via the amplitude feedback connection 132, which indicates the amplitude of CLK. The amplitude controller 114 uses the amplitude feedback to control the amplitude of CLK to approximate a target amplitude (e.g., set by a user, read from a register, etc.) that is the minimum amplitude needed to provide reliable oscillation and conserve power. Accordingly, if the amplitude feedback indicates that the amplitude of CLK is higher than the target amplitude plus a margin for hysteresis (e.g., the margin set by a user, read from a register, etc.), the amplitude controller 114 may decrease current, and if the amplitude is lower than the target amplitude, the amplitude controller 114 may increase current. In this way, the amplitude of CLK is maintained within a range defined by the target amplitude at the lower boundary and the target amplitude plus a margin for hysteresis at the upper boundary.

The mode controller 116 is configured to control the variable resistor 210, the variable capacitor 218, and the variable capacitor 220. The mode controller 116 may receive three inputs for each of the variable resistor 210, the variable capacitor 218, and the variable capacitor 220. In examples, for the variable resistor 210, the mode controller 116 may receive a target value, a time increment value, and a step size value. For the variable capacitor 218, the mode controller 116 may receive a target value, a time increment value, and a step size value. For the variable capacitor 220, the mode controller 116 may receive a target value, a time increment value, and a step size value.

Target values indicate the desired value for each respective component. For instance, the target value for the variable resistor 210 indicates the desired resistance setting for the variable resistor 210. The target value for the variable capacitor 218 indicates the desired capacitance setting for the variable capacitor 218. The target value for the variable capacitor 220 indicates the desired capacitance setting for the variable capacitor 220.

Time increment values indicate the amount of time that should elapse between each change in a component's value. For instance, the variable resistor 210 may be adjusted a first time from a current resistance value toward a target resistance value, wait for a time increment value, and then be adjusted a second time toward the target resistance value. For instance, the variable capacitor 218 may be adjusted a first time from a current capacitance value toward a target capacitance value, wait for a time increment value, and then be adjusted a second time toward the target capacitance value. For instance, the variable capacitor 220 may be adjusted a first time from a current capacitance value toward a target capacitance value, wait for a time increment value, and then be adjusted a second time toward the target capacitance value.

Step size values indicate the maximum extent to which a component may be adjusted between time increments. For instance, the variable resistor 210 may be adjusted from a current resistance value toward a target resistance value in multiple steps, each consecutive pair of steps separated by the time increment value, and each step being no larger than the step size value. The step size values may include a separate and independent step size value for each variable circuit element (e.g., variable resistor 210, variable capacitor 218, variable capacitor 220, etc.).

The mode controller 116 receives the various input values described above. Based on these inputs, the mode controller 116 controls the resistance setting of the variable resistor 210, the capacitance setting of the variable capacitor 218, and the capacitance setting of the variable capacitor 220.

The mode controller 116 may also receive the amplitude feedback on the amplitude feedback connection 132. Based on this amplitude feedback, the mode controller 116 may temporarily halt mode transitions and/or changes to variable components (e.g., responsive to the amplitude of CLK being outside of the target range described above). Example operations of the amplitude controller 114 and the mode controller 116 are described below in greater detail.

Figure 3:
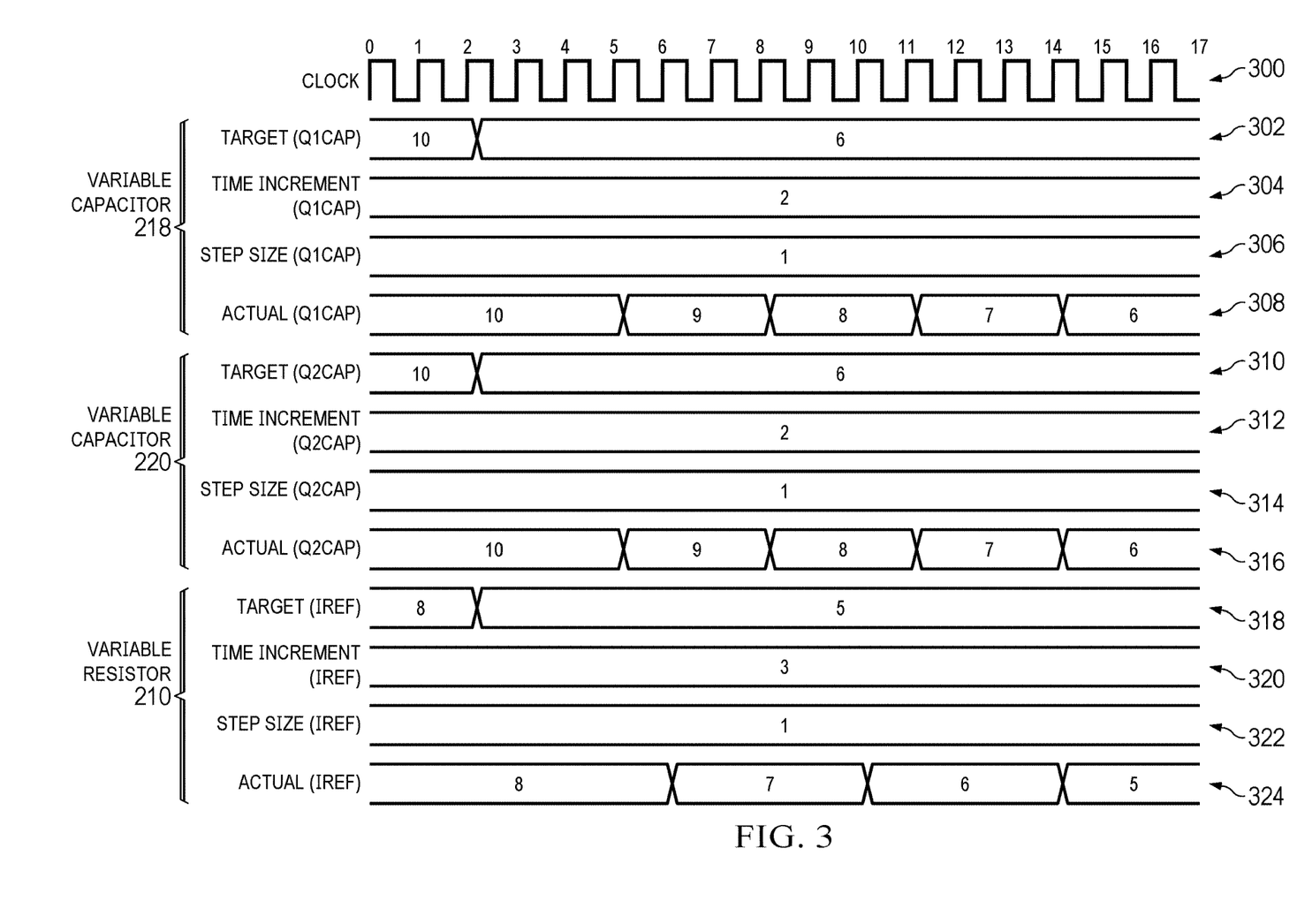
FIG. 3 is a timing diagram indicating operation of an electronic device configured to control oscillator frequency accuracy and amplitude, in accordance with various examples.

FIG. 3 is a timing diagram indicating operation of the electronic device 104, in accordance with various examples. More specifically, the timing diagram shows an example operation of the mode controller 116 (FIG. 2). A top row 300 of the timing diagram shows an example clock signal that the mode controller 116 uses. The mode controller 116 may receive the clock signal from another device, or the mode controller 116 may generate the clock signal. The clock signal has pulses, the rising edges of which are numbered 0, 1, 2, 3, etc., for ease of reference. Rows 302, 304, 306, and 308 indicate a target value, a time increment value, a step size value, and an actual value of the variable capacitor 218, respectively. Rows 310, 312, 314, and 316 indicate a target value, a time increment value, a step size value, and an actual value of the variable capacitor 220, respectively. Rows 318, 320, 322, and 324 indicate a target value, a time increment value, a step size value, and an actual value of the variable resistor 210, respectively. The various values shown in the timing diagram of FIG. 3 are not intended to be realistic values (e.g., a value of 6 in the timing diagram does not necessarily denote a capacitance value of 6 pico Farads). Instead, the example values in the timing diagram are conveniences for describing the operation of the mode controller 116.

Still referring to FIG. 3, in an example operation, the mode controller 116 was previously receiving a target value of 10 for the variable capacitor 218, but at clock cycle 2, the mode controller 116 begins receiving a target value of 6. Responsive to receiving a changed target value of 6, the mode controller 116 begins to adjust the capacitance value of the variable capacitor 218 from its current value of 10 to a target value of 6. Because the step size is 1, the mode controller 116 adjusts the capacitance value of the variable capacitor 218 from 10 to 9, then 8, then 7, then 6. Had the step size been 2, the mode controller 116 may have adjusted the capacitance value of the variable capacitor 218 from 10 to 8 to 6. Had the step size been 4, the mode controller 116 may have adjusted the capacitance value of the variable capacitor 218 from 10 to 6. In examples, the mode controller 116 may use a smaller step size than indicated in the step size value. For example, had the step size been 4, the mode controller 116 may have adjusted the capacitance value of the variable capacitor 218 from 10 to 9, then 8, then 7, and then 6. Accordingly, the step size value indicates the maximum permitted step size.

Further, the time increment value is 2. Accordingly, the mode controller 116 adjusts the current capacitance value of 10 to a target capacitance value of 6 in step sizes of 1, with each consecutive pair of steps being separated by a time increment of 2 clock cycles, plus an extra clock cycle as a buffer. For example, at the rising edge of clock cycle 2, the target value of 6 is received. At the rising edge of clock cycle 5, which is a difference of 3 clock cycles (the 2 clock cycles of the time increment plus a buffer clock cycle), the mode controller 116 adjusts the capacitance value of the variable capacitor 218 by 1, which is the specified step size. At the rising edge of clock cycle 8, which occurs after the time increment of 2 clock cycles plus a buffer clock cycle, the mode controller 116 again adjusts the capacitance value of the variable capacitor 218 by 1. This process continues until the mode controller 116 achieves the target capacitance value of 6 at the rising edge of clock cycle 14.

For the target value (row 310), time increment value (row 312), step size value (row 314), and actual value (row 316) of the variable capacitor 220, the mode controller 116 performs the same process as described above with respect to the variable capacitor 218.

For the target value (row 318), time increment value (row 320), step size value (row 322), and actual value (row 324) of the variable resistor 210, the mode controller 116 performs the same process as described above, except the mode controller 116 modifies the resistance value of the variable resistor 210 from a current value of 8 to a target value of 5, with a time increment of 3 clock cycles and a step size of 1. Thus, the actual resistance value of the variable resistor 210 shown in row 324 changes from a value of 8 to a value of 7 at the rising edge of clock cycle 6, to a value of 6 at the rising edge of clock cycle 10, to a value of 5 at the rising edge of clock cycle 14. In the event the current value (e.g., current capacitance value or current resistance value) being provided by the mode controller 116 is closer to the target value (e.g., target capacitance value or target resistance value) than the step size, the mode controller 116 may adjust the variable capacitor or resistor to the target value.

In some examples, the mode controller 116 may interleave adjustments to the current mirror 204, variable resistor 210, and variable capacitors 218, 220 to maintain energy in a crystal of the oscillator circuit 118 within a target range. For instance, the mode controller 116 may adjust the current mirror 204 to control the amplitude of CLK, followed by an adjustment to the variable capacitor 218 to control the frequency accuracy of CLK, followed by an adjustment to the variable resistor 210 to control the amplitude of CLK, followed by an adjustment to the variable capacitor 220 to control the frequency accuracy of CLK. So long as the threshold rates specified by the time increment values and step size values provided on connections 124 are not exceeded, the mode controller 116 may adjust the variable components of the oscillator circuit 118 in any suitable manner.

Figure 4:
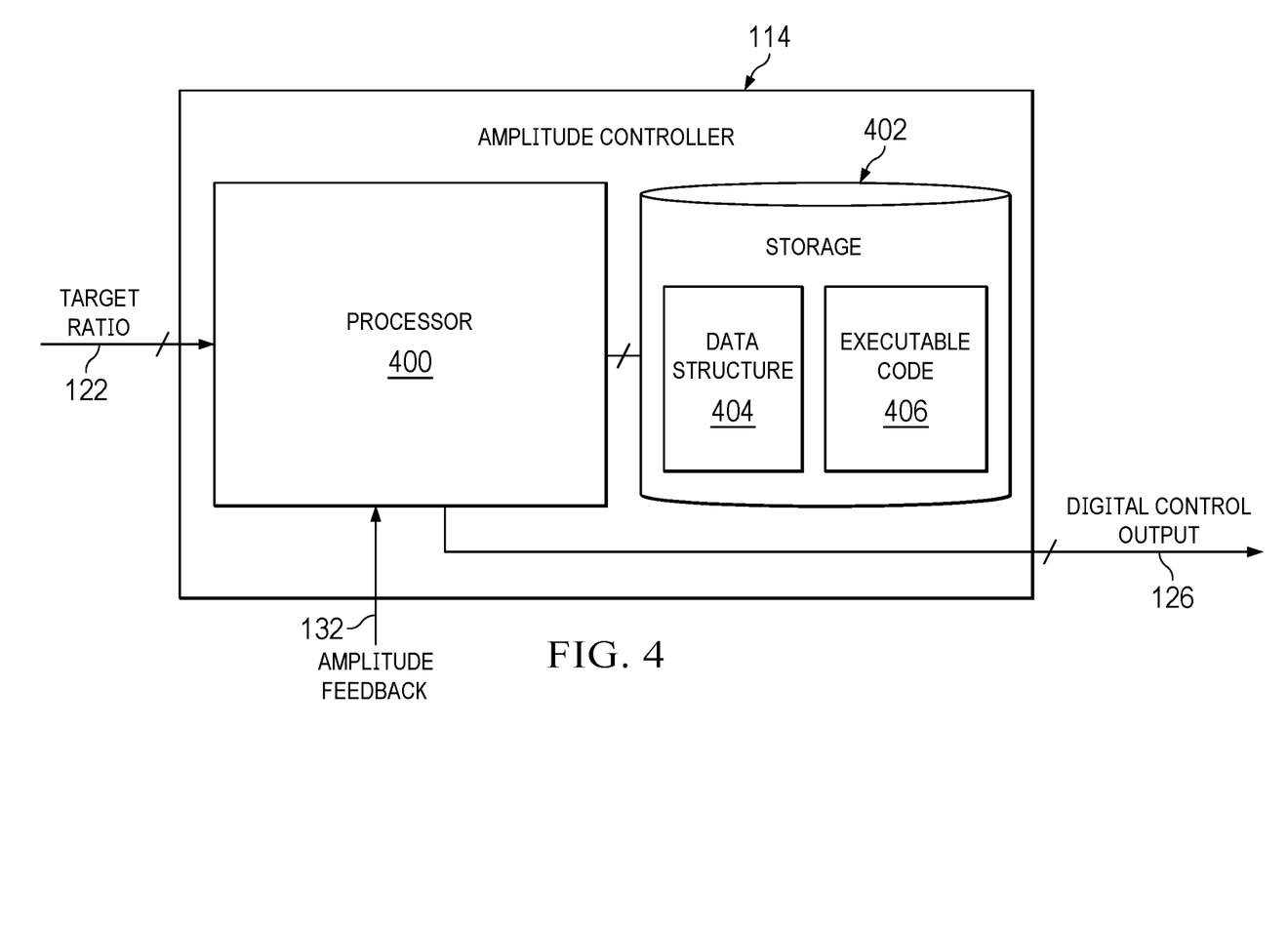
FIG. 4 is a block diagram of an amplitude controller of an electronic device configured to control oscillator frequency accuracy and amplitude, in accordance with various examples.

FIG. 4 is a block diagram of the amplitude controller 114, in accordance with various examples. The amplitude controller 114 includes a processor 400 coupled to storage 402 (e.g., random access memory, read-only memory). In other examples, the amplitude controller 114 may include a purely hardware implementation using sequential and combinational logic. The storage 402 includes a data structure 404 and executable code 406. The storage 402 may include additional data structures 404. The executable code 406, upon execution by the processor 400, causes the processor 400 to perform one or more of the actions attributed herein to the processor 400 and/or to the amplitude controller 114. The processor 400 may store data into or retrieve data from the data structure 404. The processor 400 receives the target ratio input on connection 122, as described above. The processor 400 receives the amplitude feedback on the amplitude feedback connection 132, as described above. The processor 400 provides a control signal, such as a digital control signal, on connection 126, as described above.

Figure 5:
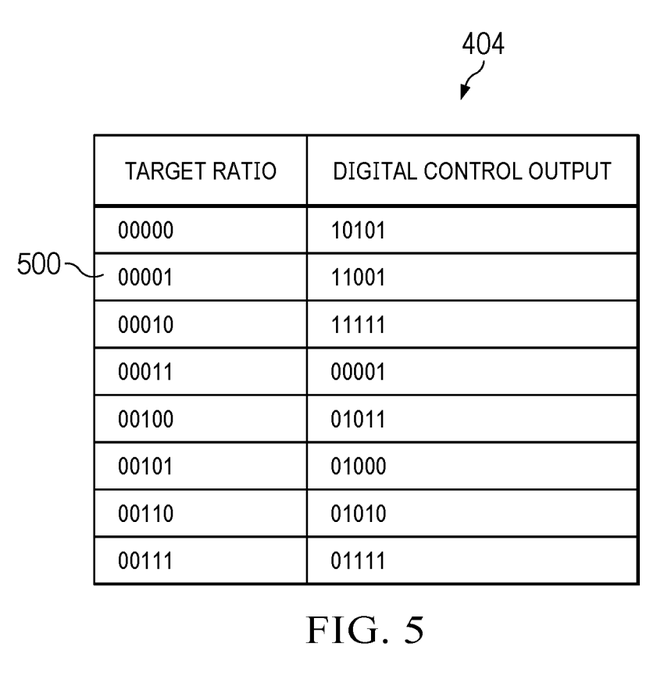
FIG. 5 shows a data structure useful in operating an electronic device configured to control oscillator frequency accuracy and amplitude, in accordance with various examples.

FIG. 5 shows an example data structure 404. The example data structure 404 includes first and second columns. The first column provides example target ratios that may be received as an input on connection 122 (FIG. 4). The inputs are shown in digital format, for example. The second column provides example digital control output values that the amplitude controller 114 may provide on connection 126 (FIG. 4). A programmer, engineer, architect, or other user may program the data structure 404 with various digital values, examples of which FIG. 5 shows.

In examples, the amplitude controller 114 may receive a target ratio, such as 00001, on connection 122. Responsive to receiving this target ratio, the amplitude controller 114 may use the data structure 404 as a lookup table, determining that the digital control output corresponding to the target ratio of 00001 is 11001 (row 500). Accordingly, the amplitude controller 114 may provide the bits 11001 to the current mirror 204 (FIG. 2) by way of connection 126. The current mirror 204 may adjust its components, such as the transistors represented by transistor 208, based on the received bits on connection 126, as described above. In this way, the data structure 404 is useful as a "translator" to convert received digital codes to digital codes that are compatible with the architecture of the processor 400 and/or that are compatible with the architecture of the current mirror 204.

Figure 6:
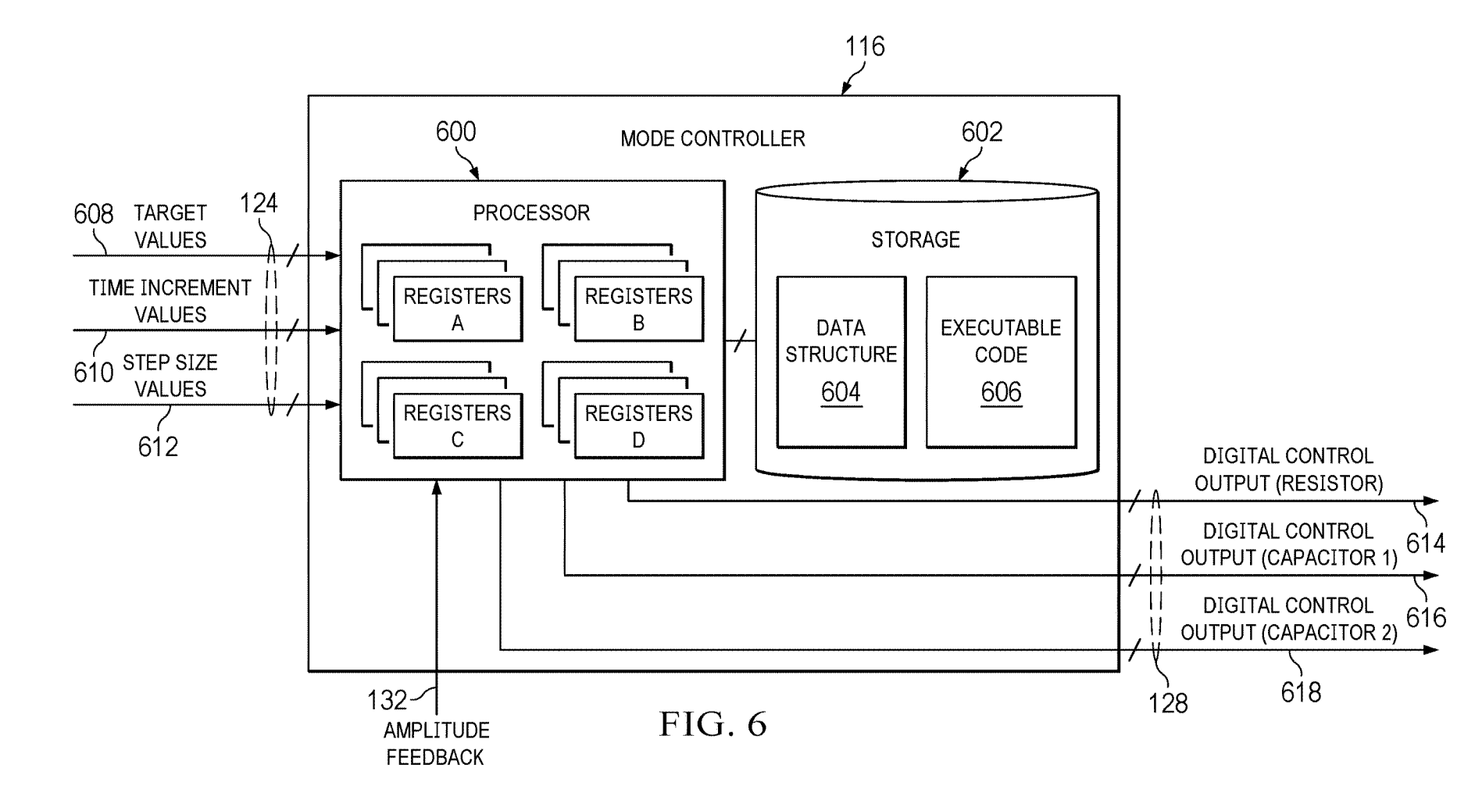
FIG. 6 is a block diagram of a mode controller of an electronic device configured to control oscillator frequency accuracy and amplitude, in accordance with various examples.

FIG. 6 is a block diagram of an example mode controller 116, in accordance with various examples. The example mode controller 116 includes a processor 600 coupled to storage 602 (e.g., random access memory, read-only memory). In other examples, the mode controller 116 may include a purely hardware implementation using sequential and combinational logic. The storage 602 includes a data structure 604, although additional data structures 604 may be included. The storage 602 includes executable code 606, which, when executed by the processor 600, causes the processor 600 to perform one or more of the actions attributed herein to the processor 600 and/or to the mode controller 116. The processor 600 stores example registers A, example registers B, example registers C, and example registers D. The processor 600 receives target values (e.g., target capacitance values for the variable capacitors 218, 220; target resistance values for the variable resistor 210) on connection 608 and stores them to registers A. The processor 600 receives time increment values on connection 610 for each of the variable capacitors 218, 220 and the variable resistor 210 and stores the time increment values in registers B. The processor 600 receives step size values on connection 612 for each of the variable capacitors 218, 220 and the variable resistor 210 and stores the step size values in register C. The processor 600 also receives amplitude feedback on the amplitude feedback connection 132, as described above. The processor 600 provides control signals (e.g., digital control signals) on connection 614 to the variable resistor 210. The processor 600 provides control signals (e.g., digital control signals) on connection 616 to the variable capacitor 218. The processor 600 provides control signals (e.g., digital control signals) on connection 618 to the variable capacitor 220. Registers D in the processor 600 store the output signals the processor 600 provides on connections 614, 616, and 618. Thus, in examples, each time the processor 600 changes the capacitance value of a variable capacitor 218 or 220, the processor 600 updates the value stored in a corresponding register D. Similarly, each time the processor 600 changes the resistance value of the variable resistor 210, the processor 600 updates the value stored in a corresponding register D.

As the processor 600 adjusts the capacitance of the variable capacitor 218 from the current value (register D) to a target value (register A), the processor 600 uses the time increment and step size values stored in registers B and C, respectively, as described above. As the processor 600 adjusts the capacitance of the variable capacitor 220 from the current value (register D) to a target value (register A), the processor 600 uses the time increment and step size values stored in registers B and C, respectively, as described above. As the processor 600 adjusts the resistance of the variable resistor 210 from the current value (register D) to a target value (register A), the processor 600 uses the time increment and step size values stored in register B and C, respectively, as described above.

Figure 7:
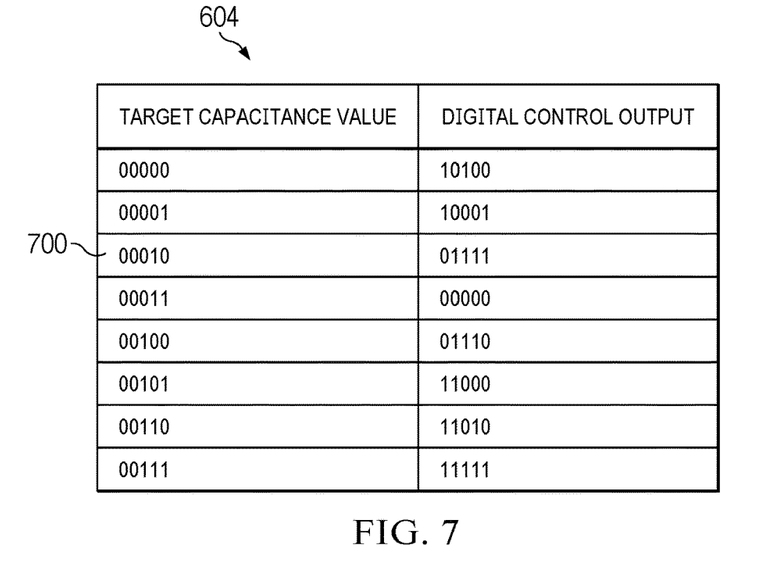
FIG. 7 shows a data structure useful in operating an electronic device configured to control oscillator frequency accuracy and amplitude, in accordance with various examples.

FIG. 7 shows an example data structure 604. The example data structure 604 includes first and second columns. The first column provides example target capacitance values that may be received as an input on connection 608 (FIG. 6). The inputs are shown in digital format, for example. The second column provides example digital control output values that the mode controller 116 may provide on connections 614, 616, and/or 618 (FIG. 6). A programmer, engineer, architect, or other user may program the data structure 604 with various digital values, examples of which FIG. 7 shows. Responsive to receiving a target capacitance value of 00010 (row 700), for example, the mode controller 116 may compare the target capacitance value to the data structure 604 as a look-up table and determine that the target capacitance value of 00010 corresponds to a digital control output value of 01111. Accordingly, the mode controller 116 may provide a digital control output value of 01111 to the variable capacitor 218 via connection 616. In this way, the data structure 604 is useful as a "translator" to convert received digital codes to digital codes that are compatible with the architecture of the processor 600 and/or that are compatible with the architectures of the variable resistor 210 and/or the variable capacitors 218, 220.

In examples, the values stored in registers A, B, C, and D in processor 600 may be those found in the left-side column of data structure 604. In examples, the values stored in registers A, B, C, and D in processor 600 may be those found in the right-side column of data structure 604. In examples, some of the values stored in registers A, B, C, and/or D are those found in the left-side column of data structure 604 and other values stored in registers A, B, C, and/or D are those found in the right-side column of data structure 604.

Figure 8:
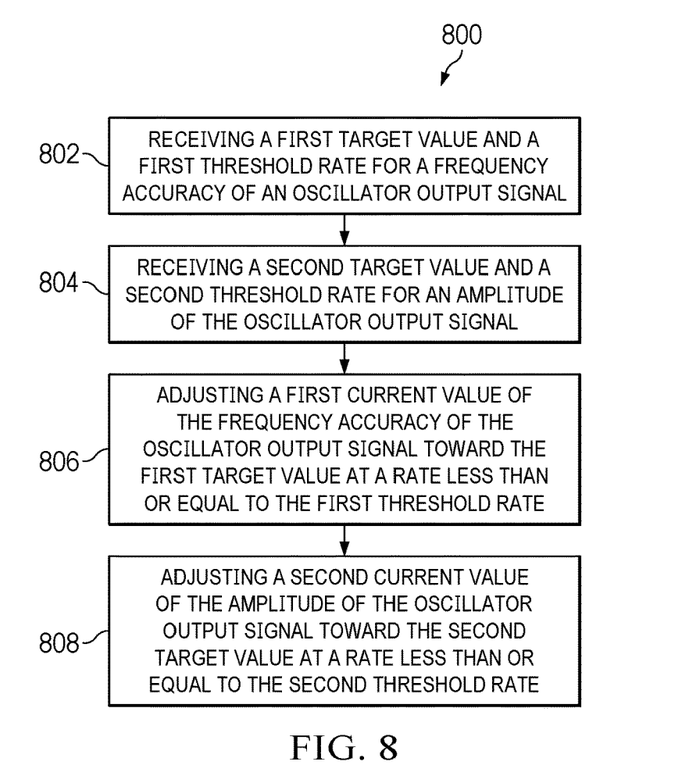
FIG. 8 is a flow diagram of a method for operating an electronic device configured to control oscillator frequency accuracy and amplitude, in accordance with various examples.

FIG. 8 is a flow diagram of a method 800 for operating the electronic device 104, in accordance with various examples. In examples, the processor 600 performs the method 800. In examples, the method 800 is encoded in the executable code 606. The method 800 begins with the processor 600 receiving a first target value and a first threshold rate for a frequency accuracy of an oscillator output signal (802). For example, the processor 600 may receive a target capacitance value for the variable capacitor 218. The processor 600 may also receive a time increment value and a step size value (which, taken together, specify a threshold rate that is the maximum rate at which the processor 600 is permitted to adjust the variable capacitor 218). In examples, the processor 600 may also receive a target value and threshold rate for the variable capacitor 220.

The method 800 includes the processor 600 receiving a second target value and a second threshold rate for an amplitude of the oscillator output signal (804). For example, the processor 600 may receive a target resistance value for the variable resistor 210. The processor 600 may also receive a time increment value and a step size value (which, taken together, specify a threshold rate that is the maximum rate at which the processor 600 is permitted to adjust the variable resistor 210).

The method 800 includes the processor 600 adjusting a first current value of the frequency accuracy of the oscillator output signal toward the first target value at a rate less than or equal to the first threshold rate (806). As described above, the processor 600 does not adjust the current value toward the target value in a step size exceeding the received step size value. Similarly, the processor 600 does not adjust the current value toward the target value more frequently than permitted by the time increment value.

The method 800 includes the processor 600 adjusting a second current value of the amplitude of the oscillator output signal toward the second target value at a rate less than or equal to the second threshold rate (808). As described above, the processor 600 does not adjust the current value toward the target value in a step size exceeding the received step size value. Similarly, the processor 600 does not adjust the current value toward the target value more frequently than permitted by the time increment value.

Figure 9:
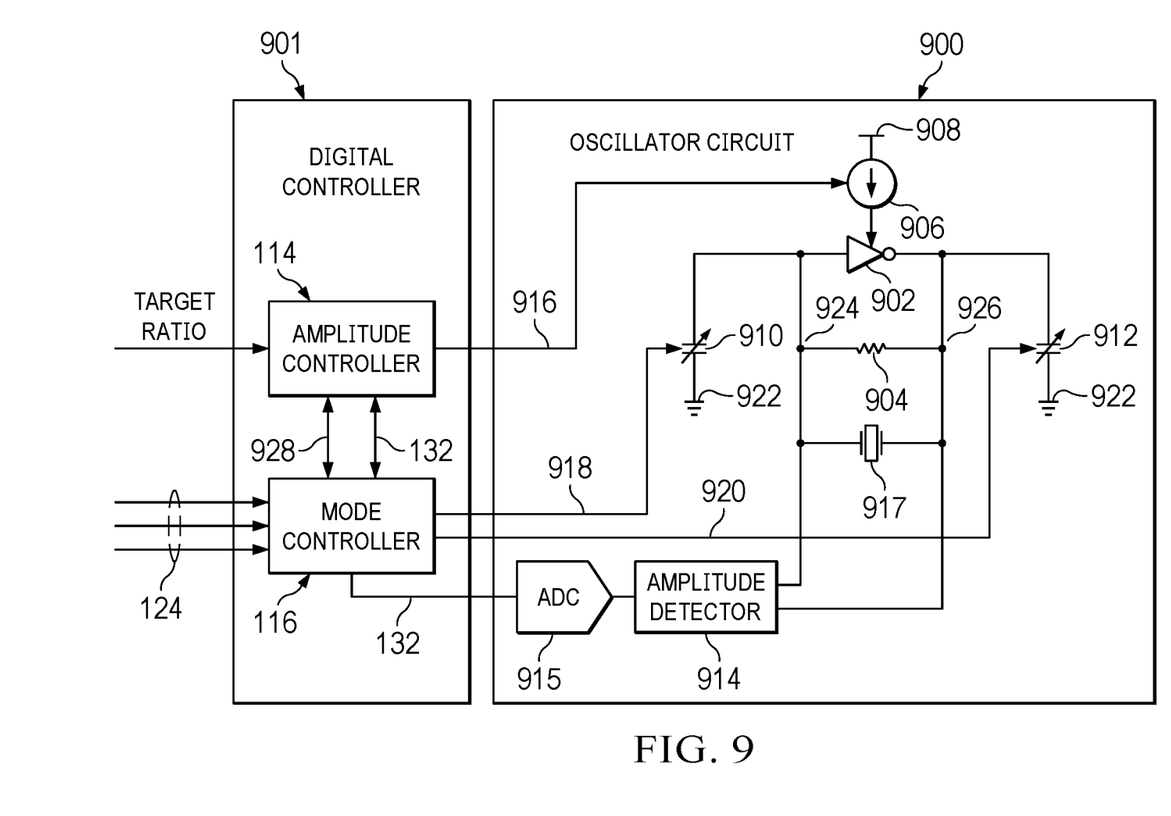
FIG. 9 is a circuit schematic diagram of an electronic device configured to control oscillator frequency accuracy and amplitude, in accordance with various examples.

FIG. 9 is a circuit schematic diagram of an example of the electronic device 104, in accordance with various examples. The example of FIG. 9 is a more generic version of the example shown in FIG. 2. The example electronic device 104 includes an oscillator circuit 900 and a digital controller 901 coupled to the oscillator circuit 900. In examples, the oscillator circuit 900 is a Pierce oscillator circuit. The scope of this disclosure includes other oscillator circuits, such as the Colpitts and Clapp oscillator circuits. Although FIG. 9 shows the oscillator circuit 900 as a crystal oscillator circuit, non-crystal oscillator circuits may be useful.

The example oscillator circuit 900 includes an inverter 902 that operates as an amplifier. A resistor 904 is coupled in parallel to the inverter 902 across nodes 924 and 926. A current source 906 is coupled to a voltage source 908 and is useful to provide current to the inverter 902. In examples, the current source 906 is a transistor (e.g., a FET) or multiple transistors (e.g., FETs) configured to increase or decrease the amount of current provided to the inverter 902 based on a control signal from the amplitude controller 114, as described below. A variable capacitor 910 is coupled to an input of the inverter 902 at node 924. A variable capacitor 912 is coupled to an output of the inverter 902 at node 926. Both the variable capacitors 910, 912 are coupled to ground 922. Variable capacitors 910, 912 are controllable by the mode controller 116, as described below. An amplitude detector 914 is coupled across the nodes 924, 926 and is coupled to an ADC 915. The ADC 915 is coupled to the mode controller 116 by way of the amplitude feedback connection 132. A crystal 917 is coupled in parallel with the resistor 904 across nodes 924 and 926.

The resistor 904 operates as a feedback resistor, biasing the inverter 902 in the linear region of operation and causing the inverter 902 to operate as a high-gain inverting amplifier. The ability of inverter 902 to provide gain is dependent upon receiving an adequate power supply for the desired gain, and the current source 906 provides this power supply. The inverter 902 and the crystal 917 form an oscillation loop similar to the loop formed by the transistor 216 and the crystal 134 in FIG. 2. Accordingly, the operation of such a loop is not repeated here. The variable capacitors 910, 912 operate similarly to the variable capacitors 218, 220 (FIG. 2), and thus their operation is not repeated here. The amplitude detector 914 detects the amplitude of the signal across nodes 924, 926 and provides an analog representation of the amplitude to ADC 915. The ADC 915 provides a digital representation of the amplitude to the mode controller 116 via the amplitude feedback connection 132. The mode controller 116 may use the digital representation of the amplitude and/or provide the digital representation of the amplitude to the amplitude controller 114 via the amplitude feedback connection 132, as described above.

The amplitude controller 114 operates as described above. Specifically, the amplitude controller 114 controls the current source 906 via connection 916, thereby controlling the amplitude of the current provided to power the inverter 902. The mode controller 116 also operates as described above. Specifically, the mode controller 116 controls the capacitances of variable capacitors 910, 912 via connections 918, 920, respectively. The mode controller 116 may provide input to the amplitude controller 114 via connection 928 about the manner in which the amplitude of the current provided by current source 906 should be controlled (e.g., a target amplitude, a rate at which the current is adjusted, etc.).

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. An electronic device, comprising:
    an oscillator circuit configured to provide an output signal; and
    a controller coupled to the oscillator circuit and configured to:
        receive first and second target rates;
        dynamically adjust a frequency accuracy of the output signal based on the first target rate;
        dynamically adjust an amplitude of the output signal based on the second target rate; and
        interleave adjustments to the frequency accuracy and the amplitude to maintain energy in a crystal of the oscillator circuit within a target range.

2. The electronic device of claim 1, wherein the oscillator circuit includes a variable capacitor, and wherein the controller is configured to dynamically adjust the frequency accuracy by adjusting the variable capacitor.

3. The electronic device of claim 1, wherein the oscillator circuit includes a variable resistor, and wherein the controller is configured to dynamically adjust the amplitude by adjusting the variable resistor.

4. The electronic device of claim 1, further comprising a second controller coupled to the oscillator circuit, the second controller configured to adjust a current mirror in the oscillator circuit to control the amplitude of the output signal.

5. The electronic device of claim 1, wherein the oscillator circuit is a Pierce oscillator circuit.

6. The electronic device of claim 1, wherein dynamically adjusting the frequency accuracy of the output signal comprises monotonically adjusting a capacitance of a variable capacitor of the oscillator circuit.

7. The electronic device of claim 1, wherein dynamically adjusting the amplitude of the output signal comprises monotonically adjusting a current flowing through the oscillator circuit.

8. An electronic device, comprising:
    an oscillator circuit including a first adjustable component configured to control a frequency accuracy of an output signal of the oscillator circuit and a second adjustable component configured to control an amplitude of the output signal; and
    a controller coupled to the oscillator circuit and configured to:
        adjust a first value of the first adjustable component to a first target value at a first rate that does not exceed a first threshold rate, wherein the first target value and first threshold rate are dynamically adjustable inputs to the controller; and
        adjust a second value of the second adjustable component to a second target value at a second rate that does not exceed a second threshold rate, wherein the second target value and the second threshold rate are dynamically adjustable inputs to the controller.

9. The electronic device of claim 8, wherein the oscillator circuit is a crystal oscillator circuit.

10. The electronic device of claim 8, wherein the oscillator circuit is a Pierce oscillator circuit.

11. The electronic device of claim 8, wherein the first adjustable component is a variable capacitor coupled to an amplifier of the oscillator circuit.

12. The electronic device of claim 8, wherein the second adjustable component is a variable resistor configured to provide a variable resistance.

13. The electronic device of claim 8, further comprising a second controller configured to control the amplitude of the output signal by adjusting a current mirror of the oscillator circuit, the current mirror coupled to an amplifier of the oscillator circuit.

14. The electronic device of claim 8, wherein the first threshold rate includes a step size and a time increment, the step size indicating a maximum permissible change in the first value toward the first target value per instance of the time increment.

15. The electronic device of claim 8, wherein the controller is configured to interleave adjustments to the first adjustable component with adjustments to the second adjustable component to maintain energy in a crystal of the oscillator circuit within a target range.

16. A method, comprising:
  receiving a first target value and a first threshold rate for a frequency accuracy of an oscillator output signal;
  receiving a second target value and a second threshold rate for an amplitude of the oscillator output signal;
  adjusting a first value of the frequency accuracy of the oscillator output signal toward the first target value at a rate less than or equal to the first threshold rate; and
  adjusting a second value of the amplitude of the oscillator output signal toward the second target value at a rate less than or equal to the second threshold rate.

17. The method of claim 16, wherein the first threshold rate includes a step size and a time increment, the step size indicating a maximum permissible change in the first value toward the first target value per instance of the time increment.

18. The method of claim 16, further comprising receiving a time increment and delaying the adjustment of the first value by the time increment.

19. The method of claim 16, wherein adjusting the first value includes adjusting a variable capacitor coupled to an amplifier in an oscillator, the oscillator configured to output the oscillator output signal.

20. The method of claim 19, wherein adjusting the second value includes adjusting a variable resistor configured to provide a variable resistance in the oscillator.

21. The method of claim 19, further comprising interleaving adjustments to the first value with adjustments to the second value to maintain energy in a crystal of the oscillator within a target range.

* * * * *